(12) United States Patent
Kim et al.

(10) Patent No.: US 7,018,912 B2
(45) Date of Patent: Mar. 28, 2006

(54) FABRICATION METHOD OF NITRIDE SEMICONDUCTORS AND NITRIDE SEMICONDUCTOR STRUCTURE FABRICATED THEREBY

(75) Inventors: Sun Woon Kim, Seoul (KR); In Eung Kim, Kyungki-do (KR); Hun Joo Hahm, Kyungki-do (KR); Soo Min Lee, Seoul (KR); Dong Joon Kim, Seoul (KR); Je Won Kim, Seoul (KR)

(73) Assignee: Samsung Electro-Mechanics Co., Ltd., Kyungki-do (KR)

(*) Notice: Subject to any disclaimer, the term of this patent is extended or adjusted under 35 U.S.C. 154(b) by 0 days.

(21) Appl. No.: 10/806,432

(22) Filed: Mar. 23, 2004

(65) Prior Publication Data

US 2005/0133812 A1    Jun. 23, 2005

(30) Foreign Application Priority Data

Dec. 20, 2003    (KR) ...................... 10-2003-0094308

(51) Int. Cl.
*H01L 21/00* (2006.01)
(52) U.S. Cl. ...................... 438/504; 438/967; 117/104
(58) Field of Classification Search ........ 438/503–506, 438/967; 117/104
See application file for complete search history.

(56) References Cited

U.S. PATENT DOCUMENTS

| | | | |
|---|---|---|---|
| 4,855,249 A * | 8/1989 | Akasaki et al. | ................ 117/95 |
| 5,290,393 A | 3/1994 | Nakamura | |
| 6,528,394 B1 | 3/2003 | Lee | |
| 2001/0026950 A1* | 10/2001 | Sunakawa et al. | ............. 438/47 |
| 2004/0115853 A1* | 6/2004 | Kobayashi et al. | ............ 438/47 |

FOREIGN PATENT DOCUMENTS

KR    2000-0055374    9/2000

* cited by examiner

*Primary Examiner*—Richard A. Booth
(74) *Attorney, Agent, or Firm*—Lowe Hauptman & Berner, LLP

(57) ABSTRACT

Disclosed is a method of fabricating nitride semiconductors in a MOCVD reactor. GaN is first deposited on an inner wall of the MOCVD reactor, and a sapphire substrate is loaded into the MOCVD reactor. The sapphire substrate is heated and etching gas is injected into the MOCVD reactor. $NH_3$ gas is injected into the MOCVD reactor to nitrify the surface of the sapphire substrate. A nitride semiconductor layer is grown on the nitrified sapphire substrate. By surface-reforming the sapphire substrate and then growing the nitride semiconductor layer on the surface-reformed sapphire substrate via MOCVD without formation of a low temperature buffer layer, an excellent nitride semiconductor structure can be realized. In this circumstance, the nitride semiconductor layer for example of GaN can be grown effectively on the surface-treated sapphire substrate because GaN deposition occurs on the sapphire substrate while it is etched.

6 Claims, 5 Drawing Sheets

X 1.000nm /div
Z 20.000nm /div

FABRICATION METHOD OF NITRIDE SEMICONDUCTORS AND NITRIDE SEMICONDUCTOR STRUCTURE FABRICATED THEREBY

BACKGROUND OF THE INVENTION

1. Field of the Invention

The present invention relates to a nitride semiconductor. More particularly, the present invention relates to a fabrication method of nitride semiconductors, by which a sapphire substrate is surface-reformed to grow a nitride semiconductor layer on the sapphire substrate via Metal-Organic Chemical Vapor Deposition (MOCVD) without formation of a low temperature buffer layer, and a nitride semiconductor fabricated thereby.

2. Description of the Related Art

A Light Emitting Diode (LED) as a kind of optoelectric device basically consists of a junction of p- and a n-doped semiconductor layers. When applied with electric current, the LED converts energy corresponding to its band gap into light through electron-hole combination. Recently, full color LEDs are produced based upon GaN compounds to emit blue, green and ultraviolet lights.

A GaN LED has a drawback that a GaN layer grown directly on a sapphire ($Al_2O_3$) substrate forms an opaque layer therebetween because GaN poorly wets with sapphire owing to the lattice constant mismatch.

A solution to this problem is disclosed in the U.S. Pat. No. 5,290,393, entitled "*Crystal Growth Method for Gallium Nitride-Based Compound Semiconductor*." This solution proposes to fabricate a GaN-based semiconductor by growing a buffer layer of nitride compound such as GaN, AlN and InN on a sapphire substrate at a low temperature of about 500° C. and then a GaN layer on the buffer layer at a high temperature.

A low temperature GaN buffer layer grown to a thickness of 20 to 30 nm is polycrystalline or has a partial metastable cubic structure. After growth of the low temperature buffer layer, temperature elevation causes GaN compound to crystallize transforming its phase partially into a stable hexagonal structure and the surface morphology of GaN compound also changes coarse forming islands. As a hot temperature GaN layer is formed on the buffer layer, the islands of the low temperature buffer layer begin to coalesce together thereby forming a fine GaN layer.

However, this solution has a drawback that surface defects such as stacking faults and threading dislocations may occur during coalescence of the islands.

In the meantime, Korean Patent Application Publication No.2000-0055374 and the U.S. Pat. No. 6,528,394 claiming its priority, entitled "Growth Method of Gallium Nitride Film", propose a GaN layer growth method via Hydride Vapor Phase Epitaxy (HVPE).

According to this document, a fine GaN layer is formed on a sapphire substrate through first nitrification, pre-treatment with ammonia ($NH_3$) and HCl gas, second nitrification and hot GaN film formation. In this circumstance, the term "nitrification" refers to unintentional formation of a thin film for example of AlN on the sapphire by flowing $NH_3$ gas onto the sapphire substrate but not to intentional formation of an AlN buffer layer.

This method is advantageous for growing a relatively thin GaN layer of about 100 to 200 μm thanks to high GaN growth rate of HVPE. However, in LED fabrication requiring a relatively thin GaN layer of about 3 to 5 μm, there is a drawback that it is difficult to control film thickness or ensure film quality.

Furthermore, although HVPE can advantageously form undoped and n-doped GaN layers on a sapphire substrate, it is necessary to load the sapphire substrate again into a Metal-Organic Chemical Vapor Deposition (MOCVD) reactor after the growth of the GaN layer to form an active region and p-doped GaN layers on the sapphire substrate to fabricate an LED.

SUMMARY OF THE INVENTION

The present invention has been made to solve the foregoing problems of the prior art.

It is therefore an object of the present invention to provide a fabrication method of nitride semiconductors by which a sapphire substrate is surface-reformed to grow a nitride semiconductor layer on the sapphire substrate via MOCVD without formation of a low temperature buffer layer.

It is another object of the present invention to provide a nitride semiconductor structure having a nitride semiconductor layer that is grown on a sapphire substrate via MOCVD without formation of a low temperature buffer layer.

According to an aspect of the invention for realizing the objects of the invention, there is provided a method of fabricating nitride semiconductors in a Metal-Organic Chemical Vapor Deposition (MOCVD) reactor, the method comprising the following steps of:

(a) depositing GaN on an inner wall of the MOCVD reactor;

(b) loading a sapphire substrate into the MOCVD reactor;

(c) heating the sapphire substrate and injecting etching gas into the MOCVD reactor; and (d) injecting $NH_3$ gas into the MOCVD reactor to nitrify the surface of the sapphire substrate.

In the method of fabricating nitride semiconductors, the step (c) irregularly etches the surface of the sapphire and re-deposits the GaN onto the surface of the sapphire from the inner wall of the MOCVD reactor, wherein the GaN re-deposited onto the sapphire is preferably amorphous or polycrystalline.

In addition, the method of fabricating nitride semiconductors may further comprise the step of growing a nitride semiconductor layer on the nitrified surface of the sapphire substrate after the step (d).

According to another aspect of the invention for realizing the objects of the invention, there is provided a method of fabricating nitride semiconductors in a Metal-Organic Chemical Vapor Deposition (MOCVD) reactor, the method comprising the following steps of:

(a) loading a sapphire substrate into the MOCVD reactor;

(b) heating the sapphire substrate and injecting Tri-Methyl Gallium (TMG) or Tri-Ethyl Gallium (TEG) on a mixed gas containing $NH_3$ gas and etching gas into the MOCVD reactor; and (c) injecting the $NH_3$ gas into the MOCVD reactor to nitrify the surface of the sapphire substrate.

In the method of fabricating nitride semiconductors, the step (b) irregularly etches the surface of the sapphire substrate and deposits GaN on the surface of the sapphire substrate.

In addition, the method of fabricating nitride semiconductors may further comprise the step of growing a nitride semiconductor layer on the surface of the nitrified surface of the sapphire substrate after the step (c).

In the afore-described methods of fabricating nitride semiconductors, the $NH_3$ gas may be replaced by one selected from a group consisting of tertiary-butylamine ($N(C_4H_9)H_2$), phenylhydrazine ($C_6H_8N_2$) and dimethylhydrazine ($C_2H_8N_2$).

In the afore-described methods of fabricating nitride semiconductors, the sapphire substrate may be replaced by one selected from a group consisting of a silicon carbide (SiC) substrate, an oxide substrate and carbide substrate.

According to yet another aspect of the invention for realizing the objects of the invention, there is provided a nitride semiconductor structure produced via MOCVD, comprising: a sapphire substrate with an upper surface etched by etching gas, deposited with GaN and nitrified; and a GaN semiconductor substrate formed on the semiconductor substrate.

In the nitride semiconductor structure, the sapphire substrate may be replaced by one selected from a group consisting of a silicon carbide (SiC) substrate, an oxide substrate and carbide substrate.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

The present invention is aimed to fabricate nitride semiconductors within a Metal-Organic Chemical Vapor Deposition (MOCVD) reactor.

Figure 1:
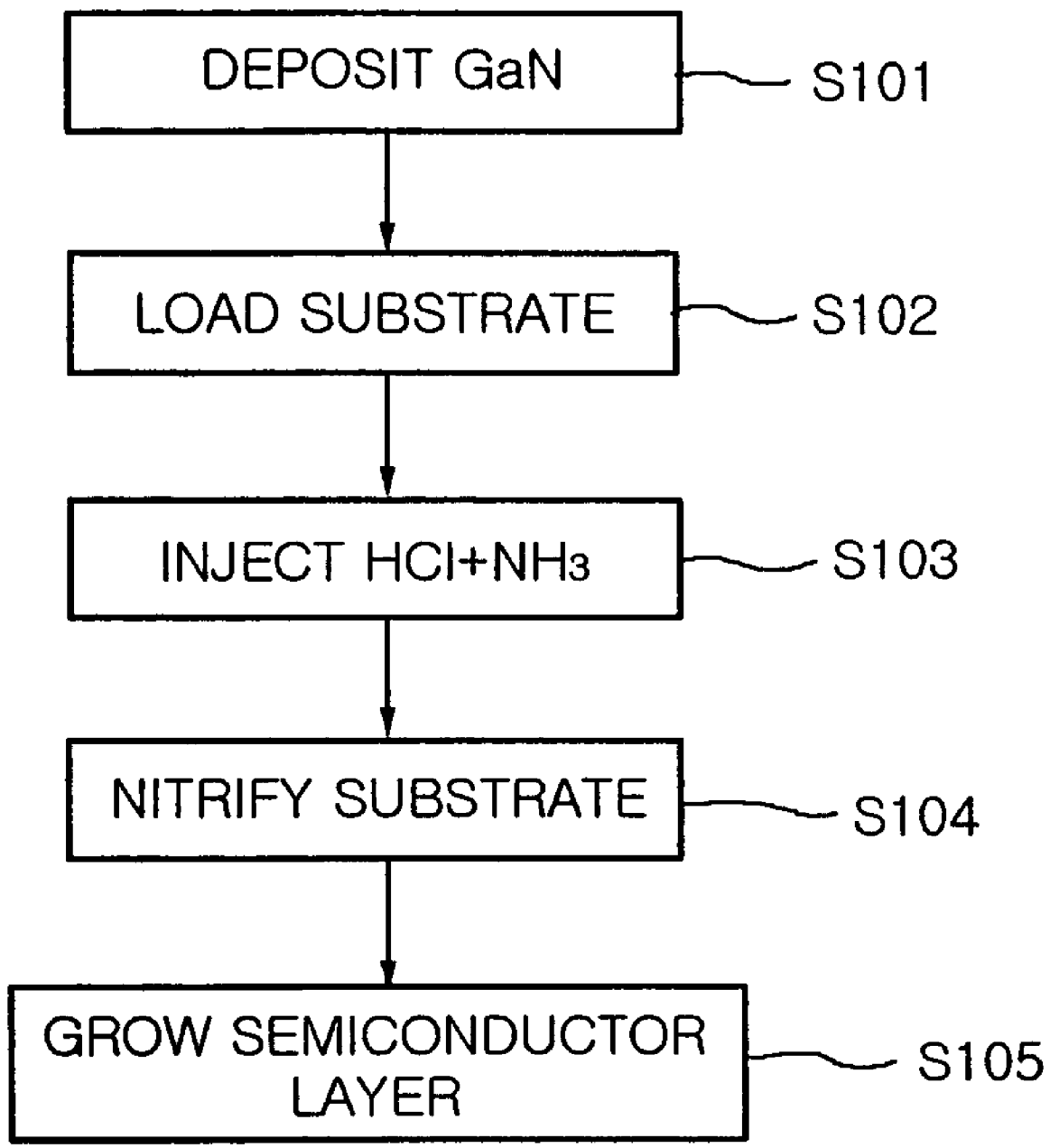
FIG. 1 is a flowchart illustrating a fabrication method of nitride semiconductors according to a first embodiment of the invention.

Hereinafter a fabrication method of nitride semiconductors according to a first embodiment of the invention will be first described with reference to a flowchart shown in FIG. 1.

According to the first embodiment of the invention, GaN is deposited on the inner wall of a MOCVD reactor in S101, and a sapphire ($Al_2O_3$) is loaded into the MOCVD reactor in S102 unlike the prior art.

In S101, Ga is injected into the MOCVD in a gas containing $NH_3$ in the form of Tri-Methyl Gallium (TMG) or Tri-Ethyl Gallium (TEG) to deposit GaN on the inner wall of the MOCVD reactor.

In S103, the sapphire substrate is heated and etching gas such as HCl is injected into the MOCVD reactor. Then, HCl etches irregularly the surface of the sapphire substrate while etching GaN deposited on the inner wall of the MOCVD so that etched GaN is peeled off from the inner wall of the reactor to re-deposit on the etched surface of the sapphire substrate. That is, the sapphire substrate is surface-treated or surface-reformed through above etching and GaN re-deposition. In this case, because the re-deposited GaN is amorphous or polycrystalline and has a high wettablity with a GaN semiconductor layer which will be grown thereon in S105 below, it can function as an excellent buffer between the GaN semiconductor layer and the underlying sapphire substrate.

In S104, $NH_3$ gas is injected into the MOCVD reactor to nitrify the surface of the sapphire substrate which was surface-reformed in S103 above. In this step, $NH_3$ can be replaced by at least one selected from a group including tertiary-butylamine ($N(C_4H_9)H_2$), phenylhydrazine ($C_6H_8N_2$) and dimethylhydrazine ($C_2H_8N_2$).

Then, in S105, a nitride semiconductor layer is grown on the nitrified sapphire substrate to realize a desired nitride semiconductor structure of the invention.

Alternatively, the sapphire substrate used in the first embodiment of the invention can be replaced by one selected from a group including a silicon carbide (SiC) substrate, an oxide substrate and a carbide substrate.

Application of the first embodiment of the invention to actual MOCVD operation has the following advantages: GaN is generally deposited on the inner wall of the MOCVD reactor in a fabrication process of nitride semiconductors. Therefore, without cleaning the MOCVD reactor after the fabrication process of nitride semiconductors, the GaN deposited on the inner wall of the MOCVD reactor can be used as a Ga source to surface-reform the sapphire substrate. That is, the GaN deposition step can be omitted by using the residual GaN formed in the conventional nitride semiconductor fabrication process.

Figure 2:
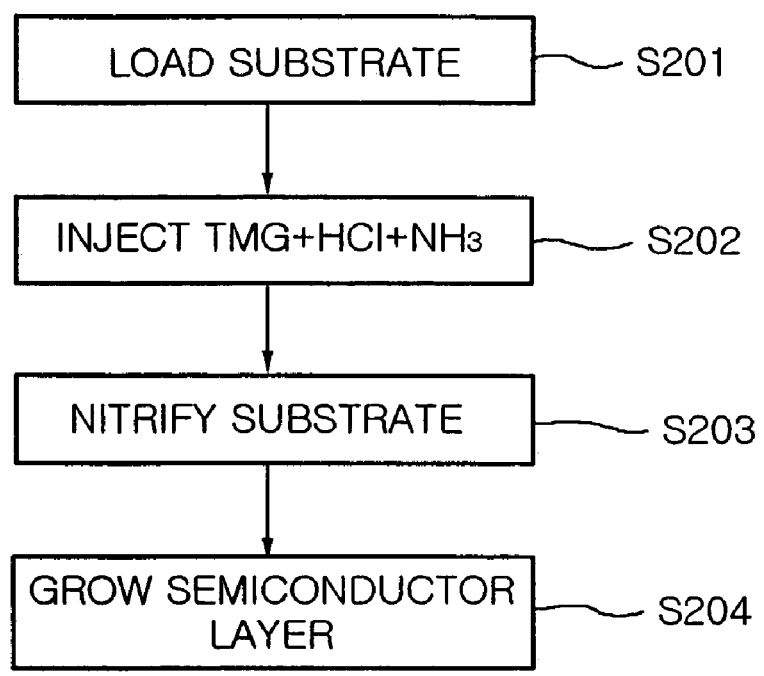
FIG. 2 is a flowchart illustrating a fabrication method of nitride semiconductors according to a second embodiment of the invention.

Hereinafter a fabrication method of nitride semiconductors according to a second embodiment of the invention will be described with reference to a flowchart shown in FIG. 2.

According to the second embodiment of the invention, a sapphire substrate is loaded into a MOCVD reactor in S201.

In S202, the sapphire substrate loaded into the MOCVD reactor is heated and Tri-Methyl Gallium (TMG) or Tri-Ethyl Gallium (TEG) is injected into the MOCVD reactor on a mixed gas containing $NH_3$ and etching gas unlike the prior art.

Then, HCl irregularly etches the surface of the sapphire substrate while GaN is deposited on the etched surface of the sapphire substrate so that the sapphire substrate is surface-treated or reformed through etching and GaN deposition. In this case, GaN deposit or a GaN deposit layer on the sapphire substrate has an excellent wettability with a GaN semiconductor layer which will be grown thereon in S204 below, it can effectively function as a buffer between the GaN semiconductor layer and the underlying sapphire substrate.

In S203, $NH_3$ gas is injected into the MOCVD reactor to nitrify the surface of the sapphire substrate which was surface-reformed in S202 above. In this step, $NH_3$ can be replaced by at least one selected from a group including tertiary-butylamine (N(C$_4$H$_9$) H$_2$), phenylhydrazine (C$_6$H$_8$N$_2$) and dimethylhydrazine (C$_2$H$_8$N$_2$).

Then, in S204, a nitride semiconductor layer is grown on the nitrified sapphire substrate to realize a desired nitride semiconductor structure of the invention.

Alternatively, the sapphire substrate used in the second embodiment of the invention can be replaced by one selected from a group including a SiC substrate, an oxide substrate and a carbide substrate.

Hereinafter a nitride semiconductor substrate obtained according to the afore-described fabrication method of nitride semiconductors of the invention will be described with reference to FIGS. 3 to 6.

Figure 3:
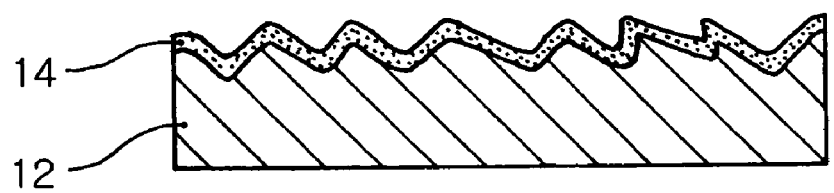
FIG. 3 is a sectional view illustrating a sapphire substrate which is surface-treated according to the invention.

First, FIG. 3 illustrates a surface-reformed sapphire substrate 12 resulting from the afore-described fabrication method, in which its surface is etched with HCl and a buffer layer 14 is deposited with GaN and nitrified.

Figure 4:
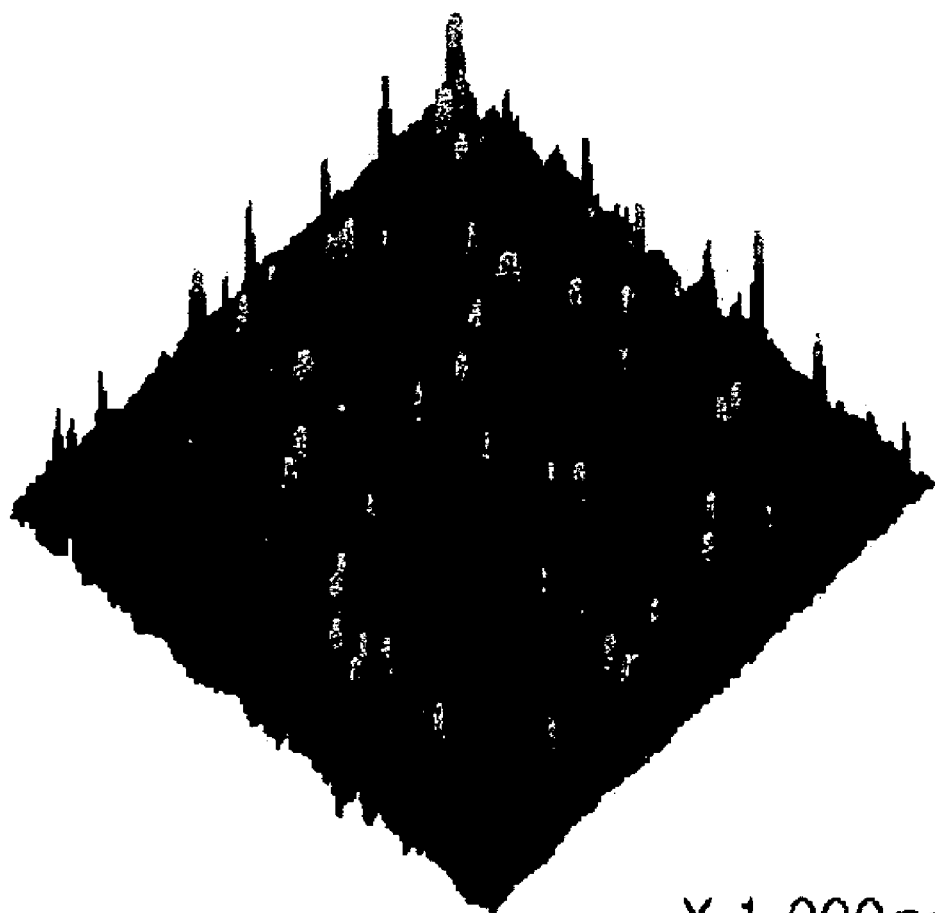
FIG. 4 is an AFM photograph of FIG. 3.

An AFM photograph in FIG. 4 more specifically illustrates the surface status of the sapphire substrate 12 in FIG. 3. The surface of the substrate 12 is etched to form a number of pillar-shaped projections as shown in FIG. 4, which facilitate deposition of GaN readily on the substrate surface.

Figure 5:
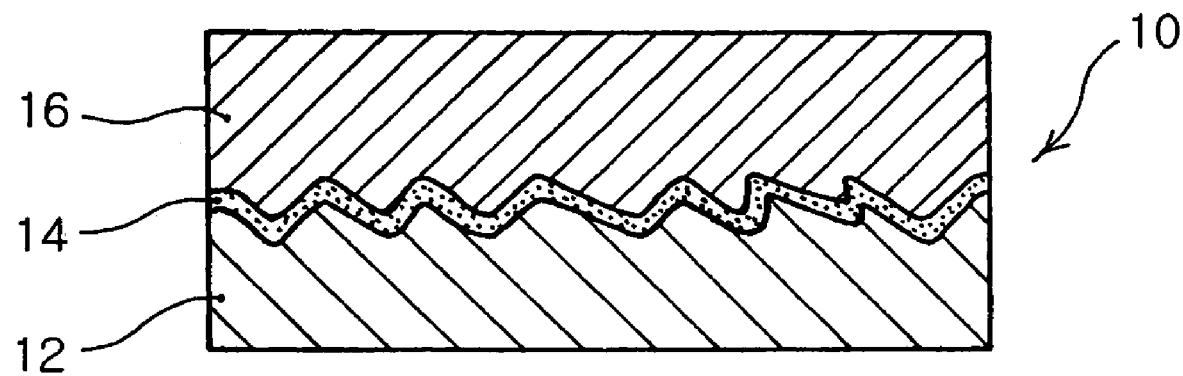
FIG. 5 is a sectional view illustrating a nitride semiconductor structure having a nitride semiconductor layer grown on the sapphire substrate shown in FIG. 3.

In a following process, a GaN semiconductor layer 16 is grown on the sapphire substrate 14 to obtain a nitride semiconductor structure 10 of the invention as shown in FIG. 5.

Figure 6:
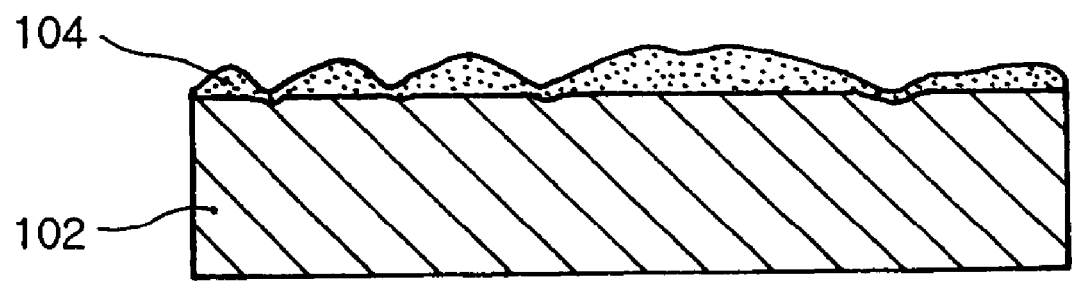
FIG. 6 is a sectional view illustrating a sapphire substrate which is surface-treated according to the invention.

FIG. 6 is a sectional view illustrating the surface structure of a sapphire substrate which is obtained according to the prior art disclosed in Korean Patent Application Publication No.2000-0055374 and the U.S. Pat. No. 6,528,394.

In the prior art, a buffer layer 104 for example of AlN is formed on the sapphire substrate 102 through first nitrification, surface-treatment with a mixed gas of NH$_3$ and HCl and then second nitrification. In more detail, the buffer layer 104 is formed by first nitrifying the substrate 102 to form a thin AlN layer on the surface of the substrate 102, etching the nitrified substrate 102, and second nitrifying the etched substrate 102.

Unlike the conventional process, the invention performs no pre-treatment to the surface of the substrate 12 but injects HCl and NH$_3$ into the MOCVD reactor while operating the MOCVD reactor so that GaN peels off from the inner wall of the MOCVD reactor and re-deposits on the upper surface of the substrate 12 to form the buffer layer 14 of the invention (First Embodiment). Alternatively, the interference layer 14 of the invention can be formed by injecting Ga in the form of TMG or TEG on a mixed gas of NH$_3$ and HCl into the MOCVD reactor while operating the MOCVD reactor so that GaN is deposited on the upper surface of the substrate 12 (Second Embodiment).

According to the invention, unlike the prior art, the buffer layer 14 on the substrate is formed of GaN compound through deposition, which is more advantageous for growing a GaN semiconductor layer thereon in the following step.

Therefore, it can be understood that the buffer layer 14 of the invention is advantageous for growth of a GaN semiconductor layer thereon because it is formed through deposition of GaN unlike the prior art.

Further, the invention can carry out the entire semiconductor fabrication process in a single MOCVD reactor without drawing the sapphire substrate out of the MOCVD reactor after GaN deposition because GaN is deposited at a relatively high temperature via MOCVD.

EXAMPLE

Sapphire substrates were surface-treated according to the first embodiment of the invention and the prior art, and their X-ray diffraction data are reported in Table 1 below.

TABLE 1

| | X-Ray Diffraction Data of Substrate Surface (unit:arcsec) | |
| --- | --- | --- |
| Classification | (002) XRD FWHM | (102) XRD FWHM |
| Inventive Example | 432 | 540 |
| Comparative Example | | |
| 1 | 1266 | 1857 |
| 2 | 1112 | 1850 |
| 3 | 966 | 1217 |

Above Diffraction Data report values of Full Width at Half Maximum (FWHM) in (002) and (102) orientations of sapphire substrates of inventive and comparative examples to compare properties thereof.

Inventive Example formed an interference layer through NH$_3$ nitrification and GaN deposition simultaneous with HCl etching according to the first embodiment of the invention. On the other hand, nitrification is accompanied with etching in Comparative Example 1, only nitrification is carried out in Comparative Example 2, and etching and following nitrification were carried out in Comparative Example 3.

As can be seen from Table 1 above, it was observed that Inventive Example has the smallest XRD FWHM and thus the best crystallinity.

Figure 7:
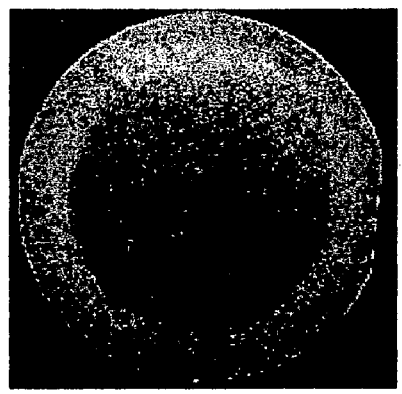
FIG. 7 is a photograph illustrating a semiconductor structure according to the invention.
Figure 8:
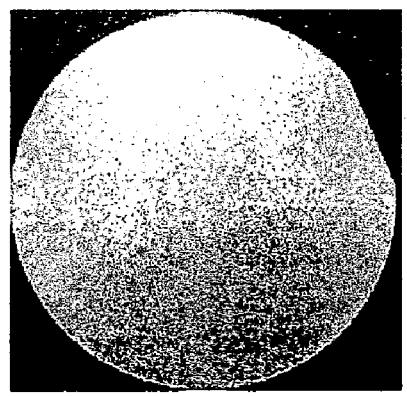
FIG. 8 is a photograph illustrating a semiconductor structure having a sapphire substrate only nitrified according to the prior art.
Figure 9:
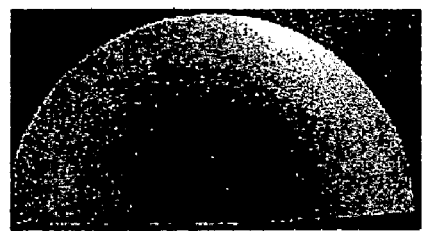
FIG. 9 is a photograph illustrating a semiconductor structure having a sapphire substrate etched with HCl according to the prior art.

Hereinafter such crystallity will be discussed with reference to FIGS. 7 to 9: FIG. 7 is a photograph of a nitride semiconductor structure which was surface-reformed according to the invention, in which a background black portion is seen through a central circle of a transparent mirror surface formed on the nitride semiconductor structure revealing. FIG. 8 is a photograph of a nitride semiconductor structure of the prior art, in which a GaN semiconductor layer was grown on a sapphire substrate only after nitrification of the sapphire substrate. This nitride semiconductor structure is opaque and thus shows poor transparency. FIG. 9 is a photograph of another semiconductor structure of the prior art, in which a GaN semiconductor layer was grown on an HCl-etched sapphire substrate. This nitride semiconductor structure is also opaque and thus shows poor transparency.

As set forth above, the invention can surface-reform a sapphire substrate and then grow a nitride semiconductor layer on the surface-reformed sapphire substrate via MOCVD without formation of a low temperature buffer layer to realize an excellent nitride semiconductor structure. In this circumstance, the nitride semiconductor layer for example of GaN can be grown effectively on the surface-treated sapphire substrate because GaN deposition occurs on the sapphire substrate while it is etched.

Further, because GaN which is deposited on the inner wall of the MOCVD reactor in the prior step can be utilized as a nitride source, the invention can have an effect of reducing a process step thereby to save raw material and cost.

Further, the invention has an advantage that the entire process can be carried out in a single MOCVD reactor.

While the present invention has been shown and described in connection with the preferred embodiments, it will be understood by those skilled in the art that various modifications and variations can be made without departing from the spirit and scope of the invention as defined by the appended claims.

What is claimed is:

1. A method of fabricating nitride semiconductors in a Metal-Organic Chemical Vapor Deposition (MOCVD) reactor, the method comprising the following steps of:
   (a) depositing GaN on an inner wall of the MOCVD reactor,
   (b) loading a sapphire substrate into the MOCVD reactor;
   (c) heating the sapphire substrate and injecting etching gas into the MOCVD reactor; and
   (d) injecting $NH_3$ gas into the MOCVD reactor to nitrify the surface of the sapphire substrate.

2. The method of fabricating nitride semiconductors according to claim 1, wherein the step (c) irregularly etches the surface of the sapphire and re-deposits the GaN onto the surface of the sapphire from the inner wall of the MOCVD reactor.

3. The method of fabricating nitride semiconductors according to claim 2, wherein the GaN re-deposited onto the sapphire is amorphous or polycrystalline.

4. The method of fabricating nitride semiconductors according to claim 1, further comprising the step of growing a nitride semiconductor layer on the nitrified surface of the sapphire substrate after the step (d).

5. The method of fabricating nitride semiconductors according to claim 1, wherein the sapphire substrate is replaced by one selected from a group including a silicon carbide (SiC) substrate, an oxide substrate and carbide substrate.

6. The method of fabricating nitride semiconductors according to claim 1, wherein the $NH_3$ gas is replaced by one selected from a group consisting of tertiary-butylamine ($N(C_4H_9)H_2$), phenylhydrazine ($C_6H_8N_2$) and dimethylhydrazine ($C_2H_8N_2$).

* * * * *